United States Patent
Hertlein et al.

(10) Patent No.: US 9,296,616 B2
(45) Date of Patent: Mar. 29, 2016

(54) GRANULAR POLYCRYSTALLINE SILICON AND PRODUCTION THEREOF

(71) Applicant: Wacker Chemie AG, Munich (DE)

(72) Inventors: Harald Hertlein, Burghausen (DE); Rainer Hauswirth, Kirchdorf (DE); Dieter Weidhaus, Burghausen (DE)

(73) Assignee: Wacker Chemie AG, Munich (DE)

( * ) Notice: Subject to any disclaimer, the term of this patent is extended or adjusted under 35 U.S.C. 154(b) by 45 days.

(21) Appl. No.: 13/888,518

(22) Filed: May 7, 2013

(65) Prior Publication Data

US 2013/0295385 A1    Nov. 7, 2013

(30) Foreign Application Priority Data

May 7, 2012    (DE) .......................... 10 2012 207 505

(51) Int. Cl.
| | |
|---|---|
| *C01B 33/02* | (2006.01) |
| *C23C 16/24* | (2006.01) |
| *C23C 16/442* | (2006.01) |
| *C01B 33/03* | (2006.01) |

(52) U.S. Cl.
CPC ................. *C01B 33/02* (2013.01); *C01B 33/03* (2013.01); *C23C 16/24* (2013.01); *C23C 16/442* (2013.01); *C01P 2002/90* (2013.01); *C01P 2004/03* (2013.01); *C01P 2004/45* (2013.01); *C01P 2004/50* (2013.01); *C01P 2006/12* (2013.01); *C01P 2006/80* (2013.01); *Y10T 428/2982* (2015.01)

(58) Field of Classification Search
None
See application file for complete search history.

(56) References Cited

U.S. PATENT DOCUMENTS

| | | | |
|---|---|---|---|
| 4,786,477 | A | 11/1988 | Yoon et al. |
| 4,851,297 | A | 7/1989 | Allen et al. |
| 4,883,687 | A | 11/1989 | Gautreaux et al. |
| 5,077,028 | A | 12/1991 | Age |
| 5,139,762 | A | 8/1992 | Flagella |
| 5,242,671 | A | 9/1993 | Allen et al. |

(Continued)

FOREIGN PATENT DOCUMENTS

| | | |
|---|---|---|
| CN | 1663911 A | 9/2005 |
| CN | 1330800 C | 8/2007 |

(Continued)

OTHER PUBLICATIONS

Pat Base Abstract for CN101318654.

(Continued)

*Primary Examiner* — Alexandre Ferre
(74) *Attorney, Agent, or Firm* — Caesar Rivise, PC (57) ABSTRACT

Granular polycrystalline silicon includes a compact matrix including radiating acicular crystal aggregates of crystal size from 0.001-200 μm. A process for producing granular polycrystalline silicon includes producing granular silicon in a fluidized bed reactor from a gas mixture containing TCS (20-29 mol %) and hydrogen at a fluidized bed temperature of 900-970° C., dividing the granular silicon in a screen system having at least one screen deck into at least two screen fractions, the smallest screen fraction being ground in a grinding system to give seed particles having a size of 100-1500 μm and a mass-based median value from 400 to 900 μm, and these seed particles being supplied to fluidized bed reactor, and a further screen fraction being supplied to a fluidized bed reactor, and being surface-treated with a gas mixture containing TCS (5.1-10 mol %) and hydrogen at a fluidized bed temperature of 870-990° C.

20 Claims, 5 Drawing Sheets

(56) References Cited

U.S. PATENT DOCUMENTS

| | | | |
|---|---|---|---|
| 5,346,141 A | 9/1994 | Kim et al. | |
| 6,267,815 B1 | 7/2001 | Ehlert et al. | |
| 7,490,785 B2 | 2/2009 | Weidhaus | |
| 7,708,828 B2 * | 5/2010 | Weidhaus et al. | 117/13 |
| 2002/0000188 A1 | 1/2002 | Weber et al. | |
| 2002/0081250 A1 | 6/2002 | Lord | |
| 2005/0135986 A1 | 6/2005 | Weidhaus et al. | |
| 2005/0244324 A1 * | 11/2005 | Hatta et al. | 423/348 |
| 2006/0088970 A1 | 4/2006 | Hesse et al. | |
| 2008/0286550 A1 * | 11/2008 | Sofin | C01B 33/035 428/220 |
| 2008/0299291 A1 | 12/2008 | Weidhaus et al. | |
| 2010/0266902 A1 | 10/2010 | Takano et al. | |
| 2011/0185963 A1 | 8/2011 | Von Ammon et al. | |
| 2012/0100059 A1 | 4/2012 | Bhusarapu et al. | |

FOREIGN PATENT DOCUMENTS

| | | |
|---|---|---|
| CN | 101311351 A | 11/2008 |
| CN | 101318654 A | 12/2008 |
| DE | 4240749 A1 | 9/1993 |
| DE | 19847695 A1 | 4/2000 |
| DE | 10025870 A1 | 12/2001 |
| DE | 10164086 A1 | 8/2003 |
| DE | 102004048948 A1 | 4/2006 |
| DE | 102007021003 A1 | 11/2008 |
| DE | 102007023041 A1 | 11/2008 |
| DE | 102010006724 A1 | 8/2011 |
| DE | 102010039754 A1 | 3/2012 |
| JP | 57067019 A2 | 4/1982 |

OTHER PUBLICATIONS

Zbib M. B. et al.: Characterization of granular silicon, powders, and agglomerates froam a fluidized bed reactor. In: J. Mater. Sci. (2012) 47: 2583-2590.
PatBase abstract for DE 102010039754.
PatBase abstract for DE 101 64 086 A1.
PatBase abstract for JP 57-067019.
http://en.wikipedia.org/wiki/Nitrile_rubber (of May 14, 2013) for http://de.wikipedia.org/wiki/Nitrilkautschuk (of Mar. 21, 2013, in German).

* cited by examiner

GRANULAR POLYCRYSTALLINE SILICON AND PRODUCTION THEREOF

BACKGROUND OF THE INVENTION

The invention relates to granular polycrystalline silicon and to the production thereof.

Granular polycrystalline silicon or granular polysilicon for short is an alternative to the polysilicon produced in the Siemens process. While the polysilicon in the Siemens process is obtained as a cylindrical silicon rod which has to be comminuted prior to further use thereof in a time-consuming and costly manner to give what is called chip poly, and may again have to be purified, granular polysilicon has bulk material properties and can be used directly as a raw material, for example for single crystal production for the photovoltaics and electronics industry.

Granular polysilicon is produced in a fluidized bed reactor. This is accomplished by fluidization of silicon particles by means of a gas flow in a fluidized bed, the latter being heated to high temperatures by means of a heating apparatus. Addition of a silicon-containing reaction gas results in a pyrolysis reaction at the hot particle surface. This deposits elemental silicon on the silicon particles, and the individual particles grow in diameter. The regular removal of particles which have grown and addition of relatively small silicon particles as the seed particles (called "seed" later in the document) enables continuous operation of the process with all the associated advantages. The silicon-containing reactant gases described are silicon-halogen compounds (e.g. chlorosilanes or bromosilanes), monosilane ($SiH_4$) and mixtures of these gases with hydrogen. Such deposition processes and apparatuses for this purpose are known, for example, from U.S. Pat. No. 4,786,477.

The granular silicon obtained from the deposition processes features high purity, i.e. a low content of dopants (especially boron and phosphorus), carbon and metals.

U.S. Pat. No. 4,883,687 discloses granular silicon defined in terms of the particle size distribution, the boron, phosphorus and carbon contents, the surface dust content, and the density and bulk density thereof.

U.S. Pat. No. 4,851,297 describes doped granular polysilicon, and U.S. Pat. No. 5,242,671 granular polysilicon with a reduced hydrogen content.

U.S. Pat. No. 5,077,028 describes a process in which granular polysilicon which features a low chlorine content is deposited from a chlorosilane.

The granular polysilicon nowadays produced on a large scale has a porous structure, and two seriously disadvantageous properties resulting from this:

Gas is enclosed in the pores. This gas is released in the course of melting and disrupts the further processing of the granular polysilicon. Attempts are therefore made to reduce the gas content of the granular polysilicon. However, as described in U.S. Pat. No. 5,242,671, an additional working step is needed, which increases the production costs and additionally causes additional contamination of the granules.

The granular polysilicon is not particularly abrasion-resistant. This means that the handling of the granules, for example in the course of transport to the user, gives rise to fine silicon dust. This dust is disruptive in several ways:

it is disruptive in the further processing of the granular polysilicon since it floats as the granules are melted;

it is disruptive in the course of transport of the granular polysilicon within the production plant because it causes deposit formation on pipelines and results in blockage of valves;

it is a potential contamination carrier owing to its high specific surface area.

Abrasion already leads to losses in the fluidized bed in the course of production of the granular polysilicon.

Disadvantageously, in the course of production based on monosilane as the silicon-containing reactant gas, amorphous silicon dust is formed directly as a consequence of a homogeneous gas phase reaction, in addition to the abrasion in the deposition process.

This ultrafine dust can partly be removed from the product, but this likewise means inconvenience, material loss and hence additional costs.

U.S. Pat. No. 7,708,828 discloses granular polycrystalline silicon consisting of particles having a density greater than 99.9% of the theoretical solid density and hence a pore fraction less than 0.1% and a surface roughness $R_a$ less than 150 nm. The particles preferably have a dopant content of boron less than 300 ppta, preferably less than 100 ppta. The particles preferably have a carbon content less than 250 ppba, preferably less than 100 ppba. The particles preferably have a total content of the metals Fe, Cr, Ni, Cu, Ti, Zn and Na of less than 50 ppbw, preferably less than 10 ppbw.

The inventive granular polysilicon can preferably be produced in a radiation-heated fluidized bed reactor.

The inventive high-purity granular polycrystalline silicon is preferably produced by deposition of a reaction gas on seed crystals of silicon in a fluidized bed. The reaction gas consists preferably of a mixture of hydrogen and silicon-containing gas, preferably halosilanes, more preferably of a mixture of hydrogen and trichlorosilane (TCS). The deposition is preferably effected at a temperature of the fluidized bed within the reaction range from 700° C. to 1200° C. The initially charged seed crystals in the fluidized bed are fluidized with the aid of a silicon-free fluidizing gas, preferably hydrogen, and heated by means of thermal radiation. The heat energy is introduced homogeneously over the area of the fluidized bed by means of flat radiant heaters. In the reaction zone, the silicon-containing reaction gas is deposited on the silicon particles as elemental silicon owing to a CVD reaction. Unreacted reaction gas, fluidization gas and gaseous reaction by-products are removed from the reactor. By regularly drawing off particles provided with the deposited silicon from the fluidized bed and adding seed crystals, the process can be operated continuously.

The temperature of the fluidized bed in the reaction region is preferably from 850° C. to 1100° C., more preferably from 900° C. to 1050° C., most preferably from 900° C. to 970° C.

The reaction gas can be injected into the fluidized bed via one or more nozzles.

The concentration of the silicon-containing reaction gas, based on the total gas rate through the fluidized bed, is preferably 10 mol % to 50 mol %, more preferably 15 mol % to 40 mol %. The concentration of the silicon-containing reaction gas in the reaction gas nozzle is, based on the total gas rate through the reaction gas nozzles, preferably from 20 mol % to 65 mol %, more preferably from 30 mol % to 65 mol %, most preferably 40 mol % to 60 mol %.

In the course of production of the granular polysilicon, only slight dust formation occurs. This and the lower level of abrasion lead to increased yields, since barely any fine dust is discharged from the fluidized bed, this always leading to a material loss in known processes.

However, the granular polysilicon known from the prior art does not have particularly good pulling properties (melt properties, lead frequencies, lead times). A description of the problem of lead frequency and lead time can be found, for example, in the Wacker Siltronic AG patent DE 10025870A1, paragraphs 0004, 0016 and 0018, and in DE19847695A1.

Part of the solution to the problem is the production of granules with much greater granule particle sizes. Production processes for large granule particle sizes require very high gas rates for fluidization in the fluidized bed reactor. In fluidized beds without a fixed bed zone in the bottom region, the greater movement of solids apparently results in contamination through the bottom region.

For the production of high-purity granular polysilicon, high-purity seed crystals are required.

Air jet mills which grind with high purity—as described in U.S. Pat. No. 7,490,785—cannot be used for large particle sizes with a mass-based median value of greater than 1250 µm.

The technical solution to date has been the use of a roll crusher. According to the abstract to JP 57-067019 (Shin Etsu Hondatai), silicon seed particles are obtained from granular silicon by comminuting them in a double roll crusher and then fractionating them by a screening operation.

Contamination of the silicon seed particles with other elements is prevented by virtue of the surface of the rolls being provided with a layer of silicon. The silicon-silicon material pair between roll and milling material, however, leads to high wear of the silicon layer on the rolls, such that only short service lives of the machine are possible before the rolls have to be exchanged. Economically viable production of seed is thus impossible.

A significant improvement with regard to roll wear is provided by the use of rolls with a hard metal surface and matched roll gap geometry, as described in DE 102004048948, but this results in contamination of the seed with B, C, Zn, Ti, Mg, W, Fe, Co, Sb and Zr.

The use of a seed mixture of screen undersize and seed ground with roll crushers ensures reduced contamination, but this is always still too high for processes such as GFZ pulling or for crucible pulling processes in the semiconductor industry. The GFZ (granular float zone) process provides for the production of a single crystal of silicon using molten granules. The process and apparatuses suitable for performance thereof are described, for example, in DE102010006724A1.

The problems described gave rise to the objective of the invention.

The object is achieved by the invention described herein.

DESCRIPTION OF THE INVENTION

The inventive granular polysilicon comprises a compact matrix and is preferably free of inclusions of ultrafine particles within the size range of less than 10 µm.

More particularly, the granular polysilicon has no particles in the nanometer range.

In the prior art, these ultrafine particles in the silicon ball led to problems in the melting characteristics, dislocation rate, lead frequency, lifetime values, crystal defects and pulling performance.

The inventive granular polysilicon has, in the compact matrix, radiating acicular crystal aggregates of a crystal size from 0.001 to 200 µm.

The crystal size is preferably 0.01 to 4 µm.

The hydrogen content of the granular silicon is in the range of 0.01 to 40 ppmw, preferably 0.01 to 35 ppmw and more preferably from 0.01 to 0.2 ppmw.

The chloride value of the granular polysilicon is preferably in the range from 9 to 39 ppmw, more preferably from 21 to 35 ppmw and more preferably from 21 to 30 ppmw.

The total carbon content in the granular polysilicon is 0.0015 to 0.09 ppma, preferably 0.0015 to 0.02 ppma and most preferably from 0.0015 to 0.015 ppma.

The carbon content in the bulk of the granular polysilicon is in the range from 0.0005 to 0.01 ppma, preferably in the range from 0.0005 to 0.005 ppma.

The fluorine content in the granular polysilicon is in the range from 0.0005 to 1 ppma, preferably in the range of 0.0005 to 0.2 ppma.

The boron content in the granular polysilicon is in the range of 0.001 to 0.09 ppba, preferably 0.001 to 0.008 ppba.

The granular polysilicon comprises a metal content of Zn, Ti, Mg, Zr, W, Fe, Co, Sb totaling in the range from 0.001 to 1.5 ppbw, more preferably in the range from 0.03 to 1.0 ppbw.

The Zn content is in the range from 0.001 to 0.4 ppbw, more preferably in the range from 0.01 to 1.0 ppbw and more preferably in the range from 0.01 to 0.1 ppbw.

The Ti content is preferably in the range from 0.0001 to 0.5 ppbw.

The Mg content is preferably in the range from 0.0001 to 0.1 ppbw.

The Zr content is preferably in the range from 0.0001 to 0.02 ppbw.

The W content is preferably in the range from 0.0001 to 0.05 ppbw.

The Fe content is preferably in the range from 0.0001 to 0.1 ppbw, more preferably in the range from 0.0001 to 0.05 ppbw.

The Co content is preferably in the range from 0.00001 to 0.002 ppbw.

The Sb content is preferably in the range from 0.0001 to 0.007 ppbw.

The $N_2$ content is in the range from 1E+18 at/cm$^3$ to 1E+15 at/cm$^3$.

The fine dust content is in the range from 0.01 to 10 ppmw.

The specific surface area is in the range from 0.1 to 30 cm$^2$/g, more preferably in the range from 1 to 25 cm$^2$/g and most preferably in the range from 1.5 to 15 cm$^2$/g.

The above-described granular polysilicon is preferably subjected to a surface treatment, which gives it an altered crystal structure.

In one embodiment, the matrix in this case comprises radiating acicular crystal aggregates, whereas a surface layer comprises acicular crystals arranged in parallel.

The invention also relates, however, to granular polycrystalline silicon in which both the matrix and the surface layer comprise acicular crystals arranged in parallel.

Surprisingly, the inventors have found a correlation between granule size and lead time, lead frequency and dislocation-free yield in the further processing to give the single crystal. The lead frequency is understood to mean the number of attempts needed to produce a dislocation-free single crystal, and the lead time to mean the time from the first contact of the seed crystal with the silicon melt to the conclusion of the pulling of the thin-neck crystal (see DE19847695A1). Much higher lifetime values are measured on the single crystal produced with inventive granular polysilicon.

It is preferably used in GFZ (600-4000 µm, preferably more than 98 percent by mass within the range of 600-2000 µm, with a mass-based median value in the range of 1200 to 2600 µm) and crucible pulling processes (600-8000 µm, preferably more than 98 percent by mass in the range of 600-4000 µm, with a mass-based median value in the range of 1200 to 2600 µm).

In addition, the inventive granular polysilicon—as described above—has a low hydrogen content. No thermal aftertreatment of the granular polysilicon is required. This leads to much lower sputtering in the course of melting. The granular silicon can be produced less expensively by dispensing with a thermal aftertreatment step with high temperatures.

The inventive granular polysilicon preferably has a thin oxide layer on the surface. The thickness of the oxide layer is preferably less than 3 atom layers and leads to better melting characteristics, lower dislocation rates and fewer crystal defects.

Moreover, the inventive granular polysilicon—as described above—preferably has a chlorine content of 9-39 ppmw. This leads to improved melting characteristics. Metallic impurities are discharged during the melting phase.

In the course of production of the inventive granular polysilicon, the gas phase is set within a temperature range between 900 and 970° C. and with a TCS content in hydrogen of 20.5 to 24 mol % (saturation: mol (TCS)/mol (TCS+$H_2$)).

Under these reaction conditions, crystalline silicon nanoparticles form in the gas phase, these not being incorporated into the granular silicon owing to the reaction conditions and the gas velocity which has simultaneously been set at a very high level within the range of 0.7 to 2.1 m/s, preferably 0.8 to 1.2 m/s, but being discharged from the reactor with the gas stream.

In contrast, in the prior art, these silicon nanoparticles were incorporated into the granular silicon particles and cause dislocations in the course of further processing in the semiconductor industry.

In the process according to the invention, these crystalline silicon nanoparticles are discharged from the reactor with the offgas.

BRIEF DESCRIPTION OF THE DRAWINGS

The invention is also illustrated hereinafter with reference to FIG. 1-6.

Figure 1:
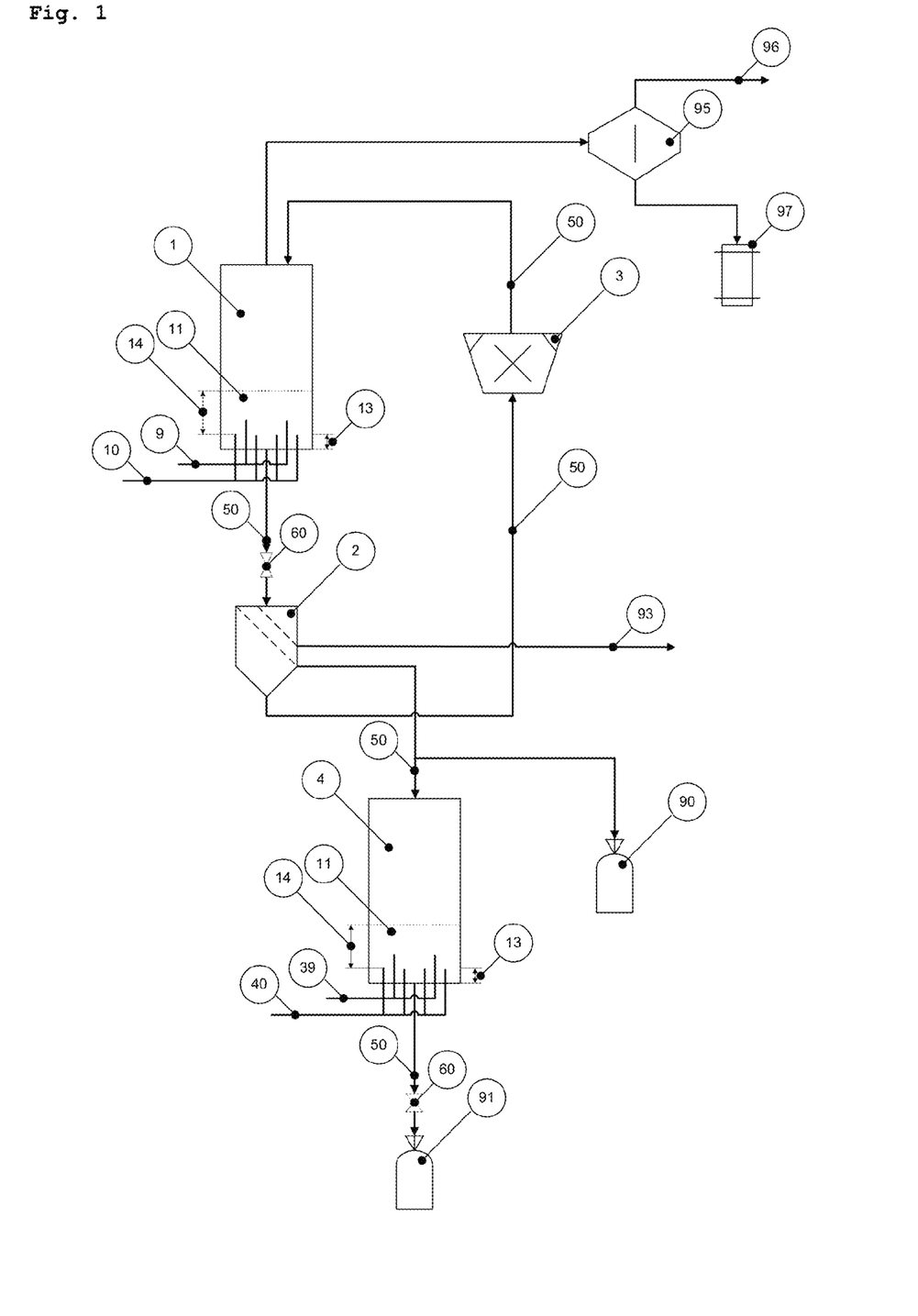
FIG. 1 shows a schematic of an apparatus for performance of the process.

After removal from the gas phase (95), these crystalline silicon nanoparticles (97) serve as an ideal feedstock for the production of printable solar cells and lithium ion batteries.

The solid-free offgas (96) is sent to a gas recovery according to the prior art.

The process for producing the inventive granules is notable for a fixed bed having a height in the range from 100 to 1000 mm, preferably in the range from 100 to 500 mm and more preferably in the range from 120 to 140 mm.

The fixed bed is achieved by virtue of the bottom gas nozzles (fluidization gas nozzles) (10) or a bottom gas distributor projecting beyond the bottom plate by 100 nm, preferably more than 120 mm.

In this fixed bed region, there is no wall heating of the reactor and the fixed bed region is more than 10 mm, preferably more than 50 mm, below the wall heating.

Alternative fixed beds without nozzles projecting beyond the bottom plate, for example large silicon balls or large silicon fragments, have been found to be disadvantageous since filling is impossible in industry without contamination and without breakage of apparatus parts.

In order to avoid contamination, it has been found to be particularly advantageous to fill the fixed bed by means of seed metering.

For a high product quality, a particularly high surface purity of the fixed bed material is of crucial significance. Therefore, granules which have been produced from the process according to the invention, or high-purity silicon etched at the surface, is used.

In order not to damage apparatus parts and the reactor wall, a fixed bed material having a mass-based maximum diameter of less than 10 mm, preferably less than 6 mm, has been found to be particularly advantageous.

In order to minimize surface contamination of the fixed bed, a mean sphericity of greater than 0.8 is preferred, greater than 0.9 more preferred and greater than 0.96 most preferred.

In order to achieve good pulling performance, a seed consisting of only one seed particle fraction has been found to be particularly advantageous.

The pulling performance of the granular silicon has been found to be particularly good when the crystal size and crystal type of the seed particle was identical to the silicon deposited from the gas phase.

It has been found that, surprisingly, the crystal type of the granular silicon is influenced by the crystal type of the seed crystals.

In the course of production of these seed crystals, composite linings are used.

The composite linings consist of silicon boards produced from high-purity mono- or polysilicon, and a polysilicon layer beneath, deposited with elevated, analytically detectable nitrogen doping.

In order to be able to constantly rule out contamination of the seed and of the product, the process according to the invention features a detection coating between the pipelines and the silicon linings.

In addition, regular analytical monitoring of the product quality takes place.

A particularly suitable detection material was found to be silicon deposited with nitrogen doping.

However, other material combinations which have good analytical measurability and do not impair the product quality are also possible. Especially suitable are hard metals, for example tungsten and tungsten carbide, stainless steel alloys or ceramics, for example zirconium, zirconium oxide and aluminum oxide. Tungsten carbide is very particularly suitable.

Nitrogen has good detectability in small traces on the seed and product surfaces by SIMS measurements, and simultaneously has the most minor adverse effects on product quality in the further processing.

Parts of the valves in contact with product are manufactured from NBR (nitrile-butadiene rubber).

In addition, the screen separation cut is raised from 500 μm to more than 750 μm.

The screen separation cut is preferably in the range between 750 and 1500 μm for the screen undersize.

The screen separation cut is selected such that the amount of screen undersize is sufficient for the production of seed.

Subsequently, the screen undersize rather than screen target particles (middle screen fraction) is ground in an air jet mill.

The air jet mill is lined with a high-purity material, preferably with silicon.

A more detailed description of a suitable grinding process can be found in U.S. Pat. No. 7,490,785.

This measure can prevent contamination of the seed particles with B, C, Zn, Ti, Mg, W, Fe, Co, Sb and Zr.

Ultrasmall traces of impurities are also cleaned from the surface by the increased gas rates and by a reactor top temperature, which is deliberately kept high, of more than 400° C., preferably more than 600° C.

The reactor top temperature can be established by virtue of the gas rates selected, the fluidized bed temperature, the selection of reactor insulation materials and the reactor tube length.

A further advantage of the inventive seed production is that the seed consists only of a single particle fraction.

Also in accordance with the invention is the possibility of production of high-purity granular silicon with the above-described properties, which additionally receives a surface treatment with an altered crystal structure.

This surface layer is produced in a granule reactor as already described, and with a TCS content in hydrogen of 1 to 15 mol %, preferably 5.1 to less than 10 mol %, most preferably 5.1 to 6.9 mol %.

The process step is characterized in that the fluidized bed temperature used in the coating reactor differs by less than +/−30° C. from the deposition temperature of the deposition reactor (900 to 970° C.)

The production of the inventive granular polycrystalline silicon is described in detail hereinafter.

In a first process stage, granular silicon is deposited in a fluidized bed reactor (1) with a gas mixture having a TCS content in hydrogen of 20 to 29 mol %, preferably 20.5 to 24 mol %, at a fluidized bed temperature (11) of 900-970° C. The gas mixture is composed of a fluidization gas, preferably hydrogen (10), and a reaction gas, more preferably TCS in hydrogen (9).

This gives rise to granular silicon having a particle size distribution (12) in the range of 150 to 10 000 µm, preferably with 98 percent by mass within the range of 600-4000 µm, with a mass-based median value (×50.3) in the range of 1200 to 2600 µm, the overall particle matrix of which consists of a silicon having homogeneous crystal size, crystal shape and purity.

The crystal arrangement in the overall matrix has radiating acicular crystal aggregates.

Moreover, the overall matrix does not contain any inclusions of silicon nanoparticles.

In a second process stage, this granular silicon is divided into at least two or more than two screen fractions in a screen system 2 with at least one screen deck.

The smallest screen fraction (screen undersize, SU) is subsequently ground in a grinding system 3 to give seed particles having a size in the range from 100 to 1500 µm and a mass-based median value in the range of 400 to 900 µm, and sent to the first process stage as seed crystals.

The screen fraction having a particle size distribution in the range of 600 to 8000 µm, with a mass-based median value in the range of 1200 to 2600 µm, is subsequently preferably packed (90).

It is preferably used in GFZ (600-4000 µm, preferably more than 98 percent by mass in the range of 600-2000 µm, with a mass-based median value in the range of 1200 to 2600 µm) and crucible pulling processes (600-8000 µm, preferably more than 98 percent by mass in the range of 600-4000 µm, with a mass-based median value in the range of 1200 to 2600 µm).

According to the invention, it can be surface-treated in a further fluidized bed reactor (4) with a gas mixture having a TCS content in hydrogen of 5.1 to 6.9 mol % at a fluidized bed temperature of 900-970° C.

The layer on the particle surface deposited in the fluidized bed reactor (4) is characterized in that the layer comprises acicular crystals arranged in parallel.

The optimization of the crystal shape allows the pulling performance of the surface-treated granular silicon (91) to be improved slightly, but at a considerable cost.

The surface layer is also characterized in that it does not comprise any ultrafine particles from the gas phase deposition or abraded material in the region of less than 10 µm. These ultrafine particles lead to disadvantages in pulling performance.

The surface layer is also characterized in that the ability of impurities to adhere on the surface thereof is not as good.

Both the fluidized bed reactor (1) and the fluidized bed reactor (4) are characterized in that a fixed bed (13) of granular silicon having a height of more than 100 mm, preferably more than 120 mm, lies on the bottom plate of the reactor.

The fixed bed is achieved by virtue of the bottom gas nozzles (fluidizing gas nozzles) (10) or a bottom gas distributor projecting beyond the bottom plate by more than 100 mm, preferably more than 120 mm.

In this fixed bed region, there is no wall heating of the reactor, and the fixed bed region is more than 10 mm below the wall heating.

In order to prevent contamination, the filling of the fixed bed is executed via the seed metering (50).

For a high product quality, a particularly high surface purity of the fixed bed material is of crucial significance.

Therefore, granular material from the process according to the invention or high-purity silicon etched at the surface is used. The latter comes, for example, from fines from the Siemens process or from granular processes from the prior art.

In order not to damage apparatus parts or the reactor wall, the fixed bed material used is silicon having a mass-based maximum diameter of less than 10 mm.

In order to minimize the surface contamination of the fixed bed, a mean sphericity of greater than 0.8 for the silicon used is preferred, greater than 0.9 more preferred and greater than 0.96 most preferred.

The fixed bed lowers the specific energy requirement of the fluidized bed reactors through heat insulation.

Surprisingly, a distinct improvement in quality was also achieved in terms of metal, phosphorus and boron values in the granular silicon through the fixed bed.

Figure 2:
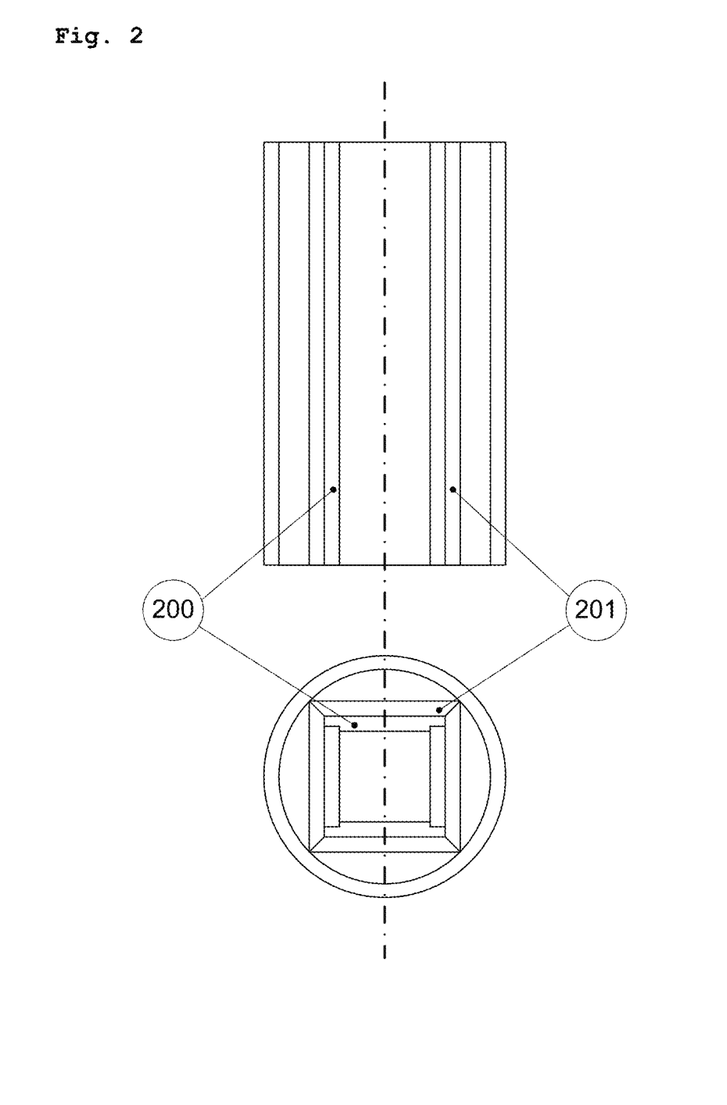
FIG. 2 shows a schematic of lining of pipelines and detection coating.

The process is preferably characterized in that, to achieve high purities, the pipelines (50) in the addition system and pipelines in the removal system are lined with mono- or polysilicon boards (200) which have been produced by sawing up silicon rods deposited with the aid of the Siemens process or in an FZ or crucible pulling process.

To avoid contamination, for detection of damaged sites in the linings, silicon rods additionally deposited with nitrogen doping are processed to silicon boards and used between lining and pipeline (201).

Alternatively, other detection materials between linings and apparatus walls are also possible.

These must be characterized in that they are of high purity, do not reduce the product quality and have good analytical measurability.

To achieve the high purity demands in the semiconductor industry, particular shut-off valves (60) are also used.

In these particular shut-off valves, all parts in contact with granular silicon are made from the material NBR.

This NBR, nitrile-butadiene rubber, is manufactured with a particularly low metal content (for example small amount of Zn as catalyst).

Figure 3:
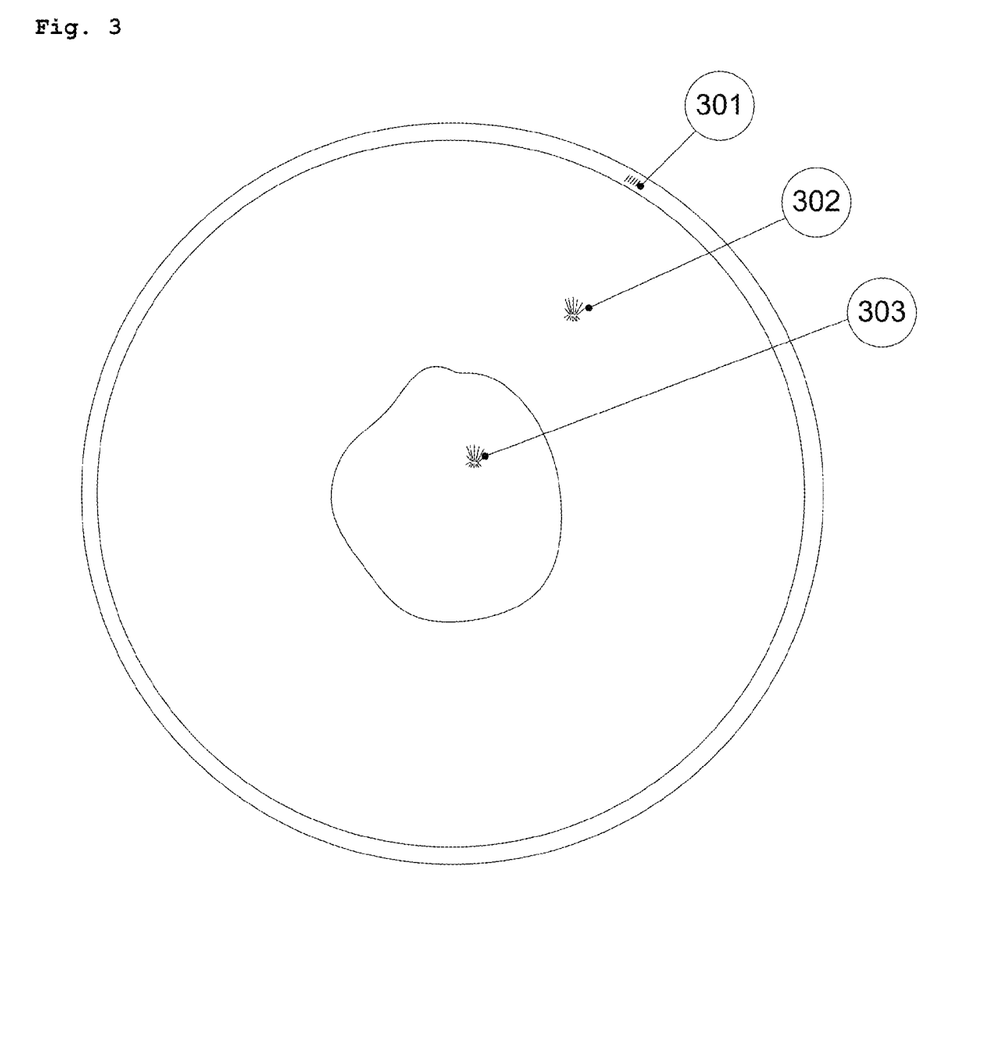
FIG. 3 shows a schematic of matrix and surface layer of granular polycrystalline silicon.
Figure 4:
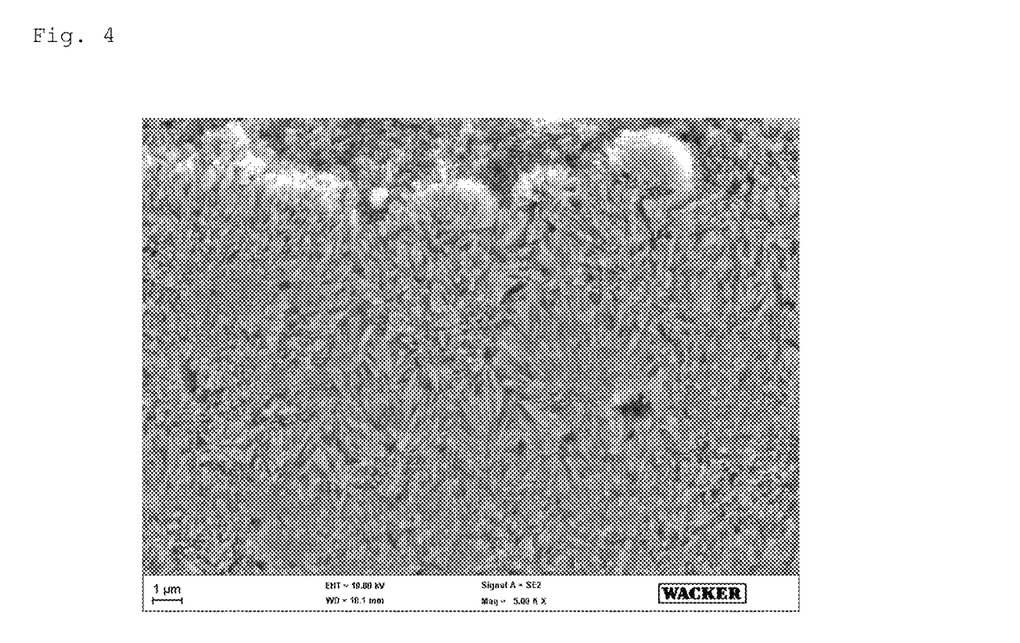
FIG. 4 shows an SEM image of granules with radiating acicular crystal aggregates.
Figure 5:
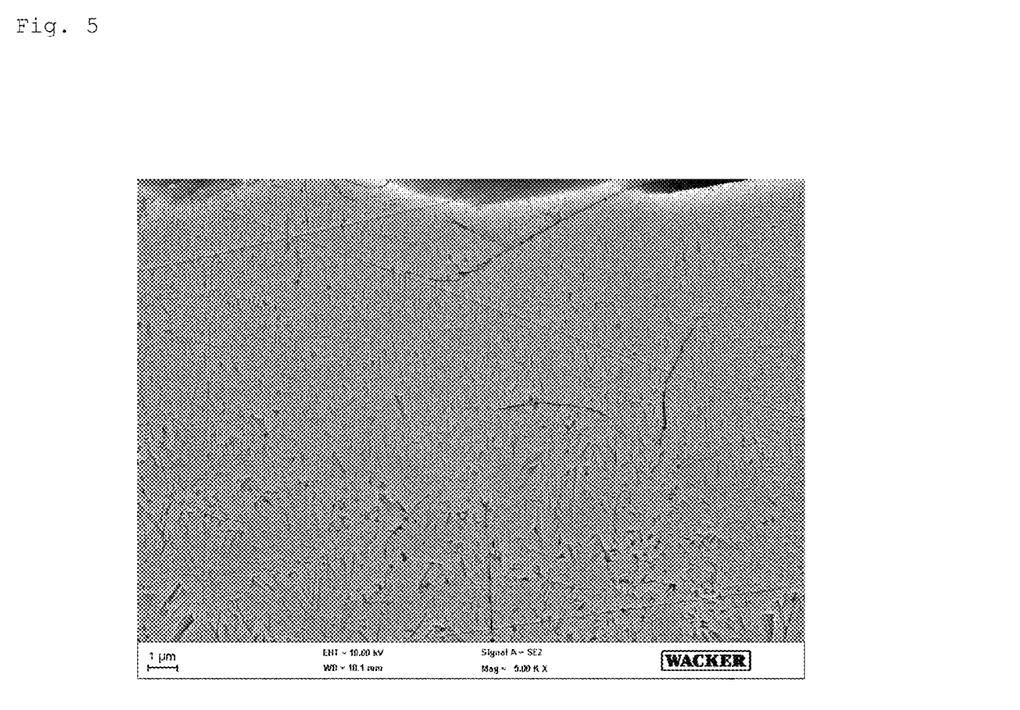
FIG. 5 shows an SEM image of granules with a layer of acicular crystals arranged in parallel.
Figure 6:
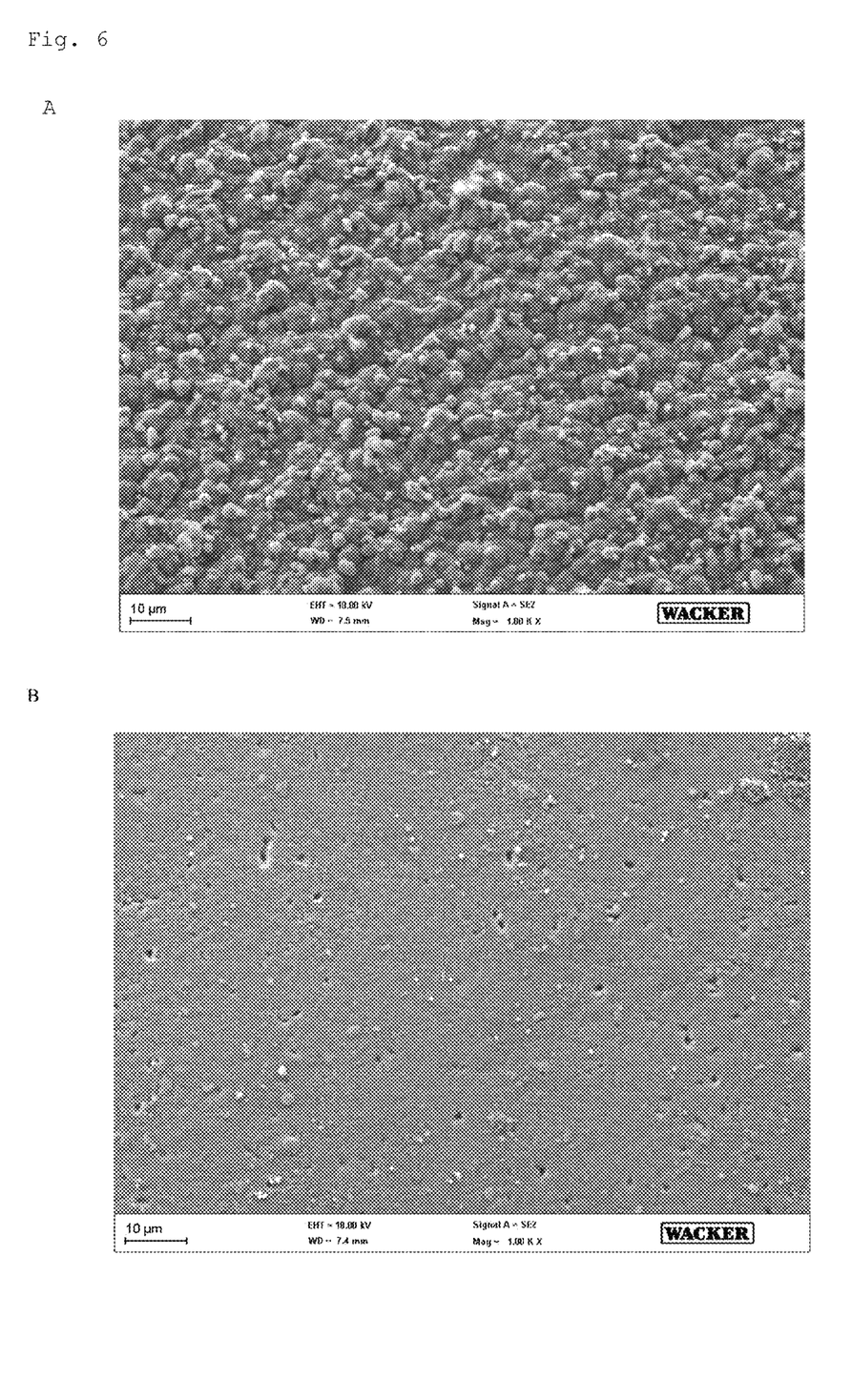
FIG. 6 shows SEM images of granules A) without gloss layer and B) with gloss layer.

FIG. 3 shows a schematic of a crystal form which has radiating acicular crystal aggregates in the particle interior (302 and 303) and a surrounding thin layer (301) with acicular crystals arranged in parallel.

The specific crystal form achieved significantly better pulling performance.

The granules are free of Zn, Zr and boron owing to the valve and pipeline lining with a detection layer of nitrogen-containing silicon.

In addition, they are low in Mg and dust due to the soil-repellant surface through optimized crystal size and crystal form.

The Cl content is 9 to 39 ppmw, more preferably from 21 to 35 ppmw and more preferably from 21 to 30 ppmw.

The crystal form and size are found from scanning electron micrographs in 5000-fold magnification of a polished section of an inventive granular polysilicon after surface etching (the granular polysilicon samples are ground, then polished and etched briefly for 5 to 10 seconds with a solution of potassium dichromate (45 g per liter of water) with 40% HF in a mixing ratio of potassium dichromate solution to HF of 1:2).

Carbon is determined to ASTM 1391-93/2000 on monocrystalline samples, boron and phosphorus to ASTM F1389-00 on monocrystalline samples, Sb to ASTM F1630-95 on monocrystalline samples, metals (Zn, Ti, Mg, Zr, W, Fe, Co) analogously to ASTM 1724-01 with ICP-MS. Fine dust is measured as described in DE2009P00133, chlorine measurement with SEMI PV 10.

Specific surface area (Sv) and particle size (minimum chord) are measured with a Camsizer from Retsch Technology (measurement principle: dynamic image analysis to ISO 13322-2, measurement range: 30 µm-30 mm, method of analysis: dry measurement of powders and granules).

Nitrogen is measured by SIMS analysis, to AN456 from EAG.

Hydrogen is determined by means of gas fusion analysis to ASTM E 1447.

The BET surface area is determined analogously to ASTM D1993.

The oxide layer thickness is measured by means of electron energy loss spectroscopy, and in the case of sufficiently thick oxide layers with an ellipsometer to ASTM 576.

The lifetime is measured based on SEMI AUX017 on monocrystalline samples.

EXAMPLES

Numerous experiments were conducted with different process conditions.

The inventive examples and comparative examples with all important process parameters and characterization data for the granules produced can be found in tables 1-3.

Table 1 shows positive examples 1 and 2 for crystal form: radiating acicular crystal aggregates and comparative example (negative example) 1 for crystal form: radiating acicular and parallel crystal aggregates.

Table 2 shows positive example 3 crystal form: radiating acicular crystal aggregates in the particle interior and acicular crystals arranged in parallel in a surrounding thin layer, and comparative example 2 for crystal form: radiating acicular crystal aggregates in the particle interior and acicular crystals arranged in parallel and radially in a surrounding thin layer.

Table 3 shows positive example 4 and comparative example 3 for crystal form: acicular crystals arranged in parallel.

TABLE 1

| | Negative example 1 | 1 | Positive example 1 | 1 | Positive example 2 | 2 |
|---|---|---|---|---|---|---|
| Process parameter | | | | | | |
| Diameter of reactor 1 [mm] | | 600 | | 600 | | 600 |
| TCS mass flow rate (9) [kg/h] | | 400 | | 710 | | 3500 |
| H2 volume flow rate (9) [m3 (STP)/h] | | 135 | | 135 | | 650 |
| H2 volume flow rate (10) [m3 (STP)/h] | | 310 | | 310 | | 1550 |
| Bed weight [kg] | | 250 | | 250 | | 350 |
| Reactor heating power [kW] | | 308 | | 308 | | 1200 |
| Seed metering rate [kg/h] | | 2.5 | | 4.5 | | 21 |
| Fluidized bed temperature [° C.] | | 971 | | 960 | | 955 |
| Screen cut [screen mesh size] [mm] | | 450 | | 750 | | 1400 |
| Target product, mass-based median value | | 1180 | | 1300 | | 2600 |
| Screen undersize, mass-based median value | | 380 | | 650 | | 1300 |
| Seed from | Grinding of screen target fraction + screen undersize | | Grinding of screen undersize | | Grinding of screen undersize | |
| Mass-based median value, seed | | 380 | | 450 | | 900 |
| Product dispensing | Under cleanroom air | | Under inert gas | | Under cleanroom air | |
| Reactor tube linings | PFA and quartz glass | | Silicon/n-silicon | | Silicon/n-silicon | |
| Bottom nozzle opening via bottom [mm] | | 0 | | 120 | | 130 |
| Product parameter | | | | | | |
| Total Zn, Ti, Mg, Zr, W, Fe, Co, Sb: ppbw | | 11 | | 0.8 | | 0.1 |
| Carbon: ppma | | 1 | | 0.01 | | 0.002 |
| Carbon in the bulk: ppma | | 0.02 | | 1 | | 0.001 |
| Boron: ppba | | 0.1 | | 0.00 | | 0.005 |
| Fine dust ppmw | | 20 | | 2 | | 8 |
| Specific surface area cm2/g | | 31 | | 0.00 | | 7 |
| Hydrogen content of the granular silicon: ppmw | | 50 | | 3 | | 0.03 |
| Pulling performance: | High dislocation rate | | Low dislocation rate | 9 | No dislocations | |
| Crystal form in the interior | Acicular, parallel and | | Acicular | 23 | Acicular | |

TABLE 1-continued

|  | Negative example 1 | 1 | Positive example 1 | 1 | Positive example 2 | 2 |
|---|---|---|---|---|---|---|
| (particle matrix): | radiating crystals |  | radiating crystals | 0.9 | radiating crystals |  |
| Crystal form in the thin outer layer: | Acicular parallel and radiating crystals |  | Acicular radiating crystals |  | Acicular radiating crystals |  |

TABLE 2

|  | Negative example 2 | 2 | Positive example 3 | 3 |
|---|---|---|---|---|
| Process parameter |  |  |  |  |
| Diameter of reactor 1 [mm] |  | 600 |  | 600 |
| TCS mass flow rate [kg/h] |  | 710 |  | 710 |
| H2 volume flow rate (9) [m3 (STP)/h] |  | 135 |  | 135 |
| H2 volume flow rate (10) [m3 (STP)/h] |  | 310 |  | 310 |
| Bed weight [kg] |  | 250 |  | 250 |
| Reactor heating power [kW] |  | 308 |  | 308 |
| Seed metering rate [kg/h] |  | 4.5 |  | 4.5 |
| Fluidized bed temperature [° C.] |  | 980 |  | 950 |
| Screen cut [screen mesh size] [mm] |  | 650 |  | 750 |
| Target product, mass-based median value |  | 1220 |  | 1300 |
| Screen undersize, mass-based median value |  | 640 |  | 660 |
| Seed from | Grinding of screen target fraction + screen undersize |  | Grinding of screen undersize |  |
| Mass-based median value, seed |  | 390 |  | 450 |
| Product dispensing | Under cleanroom gas |  | Under inert gas |  |
| Diameter of reactor 2 [mm] |  | 400 |  | 400 |
| TCS mass flow rate (39) [kg/] |  | 220 |  | 65 |
| H2 volume flow rate (39) [m3 (STP)/h] |  | 53 |  | 53 |
| H2 volume flow rate (40) [m3 (STP)/h] |  | 125 |  | 125 |
| Bed weight [kg] |  | 110 |  | 110 |
| Reactor heating output [kW] |  | 120 |  | 120 |
| Seed metering rate [kg/h] |  | 20 |  | 20 |
| Fluidized bed temperature [° C.] |  | 960 |  | 940 |
| Seed from | Screen target fraction from reactor 1 |  | Screen target fraction from reactor 1 |  |
| Product dispensing | Under cleanroom air |  | Under cleanroom air |  |
| Reactor tube linings | Quartz glass |  | Silicon/n-silicon |  |
| Bottom nozzle opening via bottom [mm] |  | 50 |  | 150 |
| Product parameter |  |  |  |  |
| Total Zn, Ti, Mg, Zr, W, Fe, Co, Sb: ppbw |  | 9 |  | 0.6 |
| Carbon: ppma |  | 0.7 |  | 0.005 |
| Carbon in the bulk: ppma |  | 0.09 |  | 0.0015 |
| Boron: ppba |  | 5 |  | 0.004 |
| Fine dust ppmw |  | 0.05 |  | 1 |
| Specific surface area cm2/g |  | 24 |  | 14 |
| Hydrogen content of the granular silicon: ppmw |  | 26 |  | 0.19 |
| Pulling performance: | High dislocation rate . . . | 42 | No dislocations . . . |  |
| Crystal form in the interior (particle matrix): | Radiating acicular crystal aggregates |  | Radiating acicular crystal aggregates |  |
| Crystal form in the thin outer layer: | Acicular, parallel and radiating crystals |  | Acicular crystals arranged in parallel |  |

TABLE 3

|  | Negative example 3 | 2 | Positive example 4 | 3 |
|---|---|---|---|---|
| Process parameter |  |  |  |  |
| Diameter of reactor 1 [mm] |  | 400 |  | 400 |
| TCS mass flow rate [kg/h] |  | 5 |  | 65 |
| H2 volume flow rate (9) [m3 (STP)/h] |  | 53 |  | 53 |
| H2 volume flow rate (10) [m3 (STP)/h] |  | 125 |  | 125 |
| Bed weight [kg] |  | 110 |  | 110 |
| Reactor heating power [kW] |  | 120 |  | 120 |
| Seed metering rate [kg/h] |  | 0.1 |  | 1 |
| Fluidized bed temperature [° C.] |  | 975 |  | 940 |
| Screen cut [screen mesh size] [mm] |  | 700 |  | 750 |
| Target product, mass-based median value |  | 1220 |  | 1300 |

TABLE 3-continued

|  | Negative example 3 | 2 | Positive example 4 | 3 |
|---|---|---|---|---|
| Screen undersize, mass-based median value |  | 645 |  | 650 |
| Seed from | Grinding of screen target fraction + screen undersize |  | Grinding of screen undersize |  |
| Mass-based median value, seed |  | 399 |  | 430 |
| Product dispensing | Under cleanroom air |  | Under inert gas |  |
| Reactor tube linings | Quartz glass |  | Silicon/n-silicon |  |
| Bottom nozzle opening via bottom [mm] |  | 50 |  | 140 |
| Product parameter |  |  |  |  |
| Total Zn, Ti, Mg, Zr, W, Fe, Co, Sb: ppbw |  | 1.6 |  | 0.7 |
| Carbon: ppma |  | 0.110 |  | 0.003 |
| Carbon in the bulk: ppma |  | 0.02 |  | 0.002 |
| Boron: ppba |  | 0.09 |  | 0.004 |
| Fine dust ppmw |  | 11 |  | 0.04 |
| Specific surface area cm2/g |  | 31 |  | 21 |
| Hydrogen content of the granular silicon: ppmw |  | 47 |  | 15 |
| Pulling performance: | Uneconomic, dislocation rate |  | Low dislocation rate |  |
| Crystal form in the interior (particle matrix): | Not clear |  | Acicular crystals arranged in parallel |  |
| Crystal form in the thin outer layer: | Not clear |  | Acicular crystals arranged in parallel |  |

What is claimed is:

1. Granular polycrystalline silicon comprising a compact matrix and a surface layer, wherein the compact matrix consists essentially of either radiating acicular crystal aggregates or acicular crystals arranged in parallel and the surface layer consists essentially of acicular crystals arranged in parallel.

2. The granular polycrystalline silicon as claimed in claim 1, wherein the compact matrix consists essentially of radiating acicular crystal aggregates.

3. The granular polycrystalline silicon as claimed in claim 2, which is free of inclusions of ultrafine particles within a size range from 1 nm to less than 10 μm.

4. The granular polycrystalline silicon as claimed in claim 3, having a particle size of 150 μm to 10 mm.

5. The granular polycrystalline silicon as claimed in claim 2, having a particle size of 150 μm to 10 mm.

6. The granular polycrystalline silicon as claimed in claim 1, wherein the compact matrix consists essentially of acicular crystals arranged in parallel.

7. The granular polycrystalline silicon as claimed in claim 6, which is free of inclusions of ultrafine particles within a size range from 1 nm to less than 10 μm.

8. The granular polycrystalline silicon as claimed in claim 7, having a particle size of 150 μm to 10 mm.

9. The granular polycrystalline silicon as claimed in claim 6, having a particle size of 150 μm to 10 mm.

10. The granular polycrystalline silicon as claimed in claim 1, which is free of inclusions of ultrafine particles within a size range from 1 nm to less than 10 μm.

11. The granular polycrystalline silicon as claimed in claim 10, having a particle size of 150 μm to 10 mm.

12. The granular polycrystalline silicon as claimed in claim 1, having a particle size of 150 μm to 10 mm.

13. The granular polycrystalline silicon as claimed in claim 1, wherein the surface layer consists of acicular crystals arranged in parallel.

14. Granular polycrystalline silicon comprising a seed, a compact matrix on the seed and a surface layer on the compact matrix, wherein the compact matrix and the surface layer consist essentially of either radiating acicular crystals aggregates or acicular crystals arranged in parallel, and the acicular crystals of at least the surface layer are arranged substantially only in parallel.

15. A process for producing granular polycrystalline silicon as claimed in claim 1, comprising a) producing granular silicon in a fluidized bed reactor from a gas mixture comprising trichlorosilane (TCS) and hydrogen with a TCS content of 20 to 29 mol % at a fluidized bed temperature of 900-970° C. and a gas velocity of 0.7 to 2.1 m/s, using seeds of high-purity silicon in a first stage, b) dividing the granular silicon obtained in a screen system comprising at least one screen deck into at least two screen fractions, and grinding a suitable screen fraction having a median value less than the median value of the granular silicon produced in a first stage in a grinding system to give seed particles having a size of 100 to 1500 μm and a mass-based median value in a range of 400 to 900 μm, and c) supplying the seed particles to the fluidized bed reactor in a second stage.

16. The process as claimed in claim 15, wherein a further screen fraction having a particle size distribution in a range of 600 to 8000 μm and a mass-based median value in a range of 1200 to 2600 μm is supplied to a fluidized bed reactor and is surface-treated with a gas mixture comprising TCS and hydrogen with a TCS content of 5.1 to less than 10 mol % at a fluidized bed temperature of 870-990° C.

17. The process as claimed in claim 16, wherein a fixed bed of granular silicon having a height of more than 100 mm lies on a base plate of the reactor in the fluidized bed reactors, the silicon used having a mean sphericity greater than 0.8.

18. The process as claimed in claim 15, wherein pipelines in an addition system and pipelines in a removal system are lined with mono- or polysilicon boards, with provision of silicon rods processed to silicon boards, deposited with nitrogen doping between lining and pipeline.

19. The process as claimed in claim 15, wherein shut-off valves are used, parts of which in contact with the granular silicon consist of nitrile-butadiene rubber.

20. A method of using granular polycrystalline silicon as claimed in claim 1 which are discharged with an offgas from a fluidized bed reactor for production of granular polycrystalline silicon for production of printable solar cells or for production of anode material for lithium ion batteries.

* * * * *